United States Patent [19]
Tsutsui et al.

[11] Patent Number: 5,748,463
[45] Date of Patent: May 5, 1998

[54] GENERATING APPARATUS FOR VEHICLE

[75] Inventors: Toshio Tsutsui, Kariya; Hirohide Sato, Toyokawa; Toshinori Maruyama, Anjo, all of Japan

[73] Assignee: Denso Corporation, Kariya, Japan

[21] Appl. No.: 760,629

[22] Filed: Dec. 4, 1996

[30] Foreign Application Priority Data

Dec. 5, 1995 [JP] Japan .................. 7-316898
Sep. 13, 1996 [JP] Japan .................. 8-243302

[51] Int. Cl.$^6$ .................................. H02M 7/217
[52] U.S. Cl. ............................... 363/127; 322/28
[58] Field of Search ................ 323/81, 84, 87, 323/125, 126, 127; 322/28, 63, 64, 68, 72, 73

[56] References Cited

U.S. PATENT DOCUMENTS

| | | | |
|---|---|---|---|
| 3,697,807 | 10/1972 | Christ | 317/16 |
| 4,362,982 | 12/1982 | Akita et al. | 322/28 X |
| 4,401,937 | 8/1983 | Morishita | 322/28 |
| 4,659,978 | 4/1987 | Dogadko | 320/71 |
| 4,808,866 | 2/1989 | Kawazoe et al. | 363/126 X |
| 5,089,766 | 2/1992 | Iwatani | 322/28 X |
| 5,202,811 | 4/1993 | Minks | 361/56 |

FOREIGN PATENT DOCUMENTS

| | | |
|---|---|---|
| 693 816 | 1/1996 | European Pat. Off. |
| 2664443 | 1/1992 | France . |
| 45-16651 | 6/1970 | Japan . |
| 63-202255 | 8/1988 | Japan . |
| 4-138030 | 5/1992 | Japan . |
| 7-337021 | 12/1995 | Japan . |
| 8-47179 | 2/1996 | Japan . |
| 8-116699 | 5/1996 | Japan . |

*Primary Examiner*—Peter S. Wong
*Assistant Examiner*—Y. J. Han
*Attorney, Agent, or Firm*—Cushman, Darby & Cushman IP Group of Pillsbury, Madison & Sutro LLP

[57] ABSTRACT

A generating apparatus for a vehicle is composed of an AC generator, a battery and a rectifying bridge circuit. The bridge circuit is composed of high-side elements and low-side elements. One of the low-side rectifying elements which is connected to an armature coil generating the giant-pulse-voltage is turned on to circulate the giant-pulse-voltage in the armature coils, thereby suppressing the giant-pulse-voltage.

13 Claims, 11 Drawing Sheets

MOST

IGBT

FIG. 7D

BPT

FIG. 7E

SiC-MOST

GENERATING APPARATUS FOR VEHICLE

BACKGROUND OF THE INVENTION

1. Field of the Invention

The present invention relates to an generating apparatus for a vehicle which includes an AC generator having a rectifying bridge circuit composed of a plurality of transistors.

2. Description of the Related Art

JPB2 45-16651 proposes a three-phase full-wave rectifier using constant-voltage-diodes instead of common junction diodes.

JPA 63-2022255 discloses a bridge circuit which is composed of MOS transistors and high-voltage diodes (which have the withstand 1.5 to 3 times as high voltage as the battery voltage) connected in parallel with the MOS transistors and is disposed between a three-phase AC generator-motor and a battery to provide DC-AC conversion therebetween.

The constant diodes clamp or suppress excessively high voltage (hereinafter referred to as the giant-pulse-voltage) generated at each terminal of the generator, when an electric load of the rectifier is disconnected.

JPA 4-138030 proposes a three-phase full-wave rectifier composed of MOS power transistors.

JPA 8-116699 filed by the assignee proposes an inverter circuit which controls the leading-power-factor-operation.

On the other hand, it is well-known that an inverter composed of bipolar transistors or IGBTs converts the DC power of a battery into a three-phase AC power to be applied to the armature winding of a three-phase AC generator. Usually, junction diodes are connected in parallel with the bipolar transistors or IGBTs (insulated-gate-bipolar-transistors) in the direction to rectify the output voltage.

However, in order to suppress the giant-pulse-voltage by the above-stated constant-voltage-diodes, a plurality of expensive diodes of large current capacity are necessary, resulting in increase of elements, assembling steps and size of the apparatus.

SUMMARY OF THE INVENTION

The present invention is made under the above circumstances, and has an object to provide a generating apparatus for a vehicle having a bridge circuit which suppresses the giant-pulse-voltage generated at each terminal of the generator without using constant diodes of a large capacity.

Another object of the present invention is to provide a generating apparatus for a vehicle which suppresses the giant-pulse-voltage generated at each terminal of the generator without using constant-voltage-diodes of a large capacity and supplies electric power to electric loads constantly.

The bridge circuit is composed of MOS transistors to control the leading-power-factor-operation and high-speed switching operation and is suitable for a high-speed bridge circuit because the high-speed-switching operation of the bridge circuit reduces power-loss during the switching operation. However, in order to protect oxide film of the gate of the MOS transistor, it is important to prevent the giant-pulse-voltage from being applied to the source or drain thereof.

Therefore, a third object of the present invention is to provide a generating apparatus for a vehicle which has a MOS-transistor-type bridge-circuit in which the oxide film of the gate is protected from the giant-pulse-voltage without increase of the structure and size of the circuit.

According to a main feature of the present invention, an electric current caused by the giant-pulse voltage is circulated and attenuated in the bridge circuit and armature coils of the generator by turning on a pair of a high-side element and a low-side elements of the bridge circuit. That is, the surge power causing the giant pulse voltage is attenuated by the resistances of the transistors, lead wires and the armature coils.

One of a pair of the high-side element and low-side element forming an inverter circuit for one phase of the bridge circuit can be a junction diode.

In more detail, the bridge circuit is composed of a same number of parallel inverters as the phase, each of which is composed of a series circuit of a high-side rectifying element and a low-side rectifying element. The output current is supplied from the high-side elements of two inverters or the high-side element of an inverter for one phase according to an amount of the current and the phase angle thereof.

If a lead wire connected to the battery is disconnected while the output current is supplied therethrough to the battery, the giant-pulse voltage is generated in one of the armature coils supplying the charging current. However, one of the armature coils to which the charging current flows through a corresponding one of the law-side elements is grounded. If the phase angle of the generated voltage changes as the generator rotor rotates, the giant-pulse-voltage remains as it was generated at the time of the disconnection. One of the armature coil generating minus voltage at the time of the disconnection is clamped to the ground level by the diode of the low-side element to maintain a take-in-current mode. Thus, although the giant-pulse-voltage is generated at an output terminal of one of the armature coils which is in a phase different from the armature coil clamped to the ground level, it is limited to a certain level.

The giant-pulse-voltage is related to the on-resistance (resistance of the transistor in the turning-on state) of the transistor of the short-circuiting means. If the on-resistance is small, the giant-pulse-voltage is attenuated in a short time and the excessive-voltage-detecting-circuit turns off the transistor, thereby, to generate the giant-pulse-voltage again. Such intermittent operation of the transistor is repeated at a high speed until the giant pulse is suppressed. Even if the giant-pulse-voltage is not generated by turning off the transistor through the high-side element, the giant pulse may be generated by different one of the armature coils. This problem is prevented by providing other armature coils with the short-circuiting means.

The bridge circuit with parasitic diodes energizes the electric load almost continuously. This operation is especially useful to an electric load which is weak in the power stop such as ECU.

According to another feature of the present invention, the transistor used as the low-side element connected to one of the armature coils generating a lowest voltage is turned on. Thus, the transistor clamps a terminal of the one of the armature coils generating the giant-pulse-voltage to suppress the giant-pulse-voltage.

According to another feature of the present invention, the MOS transistor of the low-side elements of the bridge circuit is turned on when one of the armature coils connected thereto generates the giant-pulse-voltage, thereby preventing the giant-pulse-voltage.

Particularly, a constant-voltage-drop-element is connected between the drain and gate of the MOS transistor. The constant-voltage-drop-element does not turn if corresponding armature coil does not generate the giant-pulse-voltage (or generates voltage lower than the second voltage level). When it turns on, the MOS transistor connected thereto turns on to discharge the giant-pulse-voltage to a ground, thereby suppressing the giant-pulse-voltage reaching the electric loads. Therefore, the giant-pulse-voltage is substantially suppressed only by adding a simple circuit, and the withstand-voltage between the drain and gate and the punch-through voltage between the drain and source of the MOS transistor.

According to another feature of the present invention, the second voltage level which is the threshold level for detecting the giant-pulse-voltage is between 2-3 times as high as the battery voltage, thereby preventing an excessive voltage reaching the electric loads connected to the B-terminal.

According to another feature of the present invention, the second voltage level is higher than a voltage which is the forward-voltage-drop of the diode plus the first voltage level. Therefore, the armature coils operating in the normal condition are not short-circuited, thereby preventing an excessive voltage from reaching the battery and the electric loads.

According to another feature of the present invention, the transistor is the SiC-MOS transistor which has much smaller on-resistance than the Si-MOS transistor. Therefore, it can rectify the AC current with small loss. The SiC-MOS transistor has high thermal withstand-characteristics and a high thermal conductivity and, therefore, the transistor does not break down due to heat caused while it suppresses the giant-pulse-voltage.

According to another feature of the present invention, the high-side element or low-side element is a parallel circuit composed of a bipolar transistor or IGBT and a junction diode connected in the direction to rectify the output voltage of the generator. In this case, the giant-pulse-voltage is suppressed in the same manner as above by short-circuiting the armature coil through the bipolar transistor or IGBT and the junction diode on the same side but connected to a different one of the armature coils, thereby suppressing the giant-pulse-voltage with ease.

According to another feature of the present invention, the transistor for suppressing the giant-pulse-voltage is not completely turned on when the giant-pulse-voltage is generated but is controlled by a pulse-width modulated signal to have an average conducting ratio, thereby preventing overheating and break-down of the transistor.

According to another feature of the present invention, the short-circuiting means keeps the transistor conductive for a certain period after the giant-pulse-voltage is detected. Therefore, the short-circuiting is maintained until the giant-pulse-voltage is attenuated and the electromotive force in the armature coil lowers to a certain level, thereby preventing the giant-pulse-voltage.

According to another feature of the present invention, the MOS transistor connected to one of the armature coils generating the giant-pulse-voltage is controlled while the giant-pulse-voltage is being generated to suppress the giant-pulse-voltage as far as the corresponding armature coil energizes the electric load.

Thus, when the battery is disconnected, the giant-pulse-voltage is not applied to the electric loads while the electric supply to the electric loads is continued.

According to another feature of the present invention, the MOS transistors are used in both high-side and low-side elements. Therefore, the MOS transistor is turned on when the giant-pulse-voltage is generated to attenuate the giant-pulse-voltage so that the voltage between the source or drain and the gate of the MOS transistor does not become too high to break the insulation layer of the gate. As a result, the leading-phase-control or high-speed switching-control can be carried out by the MOS transistor-type bridge circuit, thereby improving reliability thereof without using elements of large-current-capacity.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS (First Embodiment)

A generating apparatus for a vehicle, in which the output voltage of an AC generator for a vehicle (alternator) is rectified to charge a battery, is described with reference to FIG. 1 hereafter.

A reference numeral 1 is a three-phase AC generator for a vehicle and the output terminals of the armature coils 11-13 are connected to respective AC terminals 41-43 of a three-phase full-wave rectifier 3 whose DC terminals are connected to both terminals of a battery 7, between which an electric load 9 is connected through a switch 10.

A reference numeral 2 is a field coil, whose one end is connected to the plus terminal of the battery 7 and the other end is connected to the collector of a transistor 51 having the grounded emitter held in a generation-control-circuit 5. A reference numeral 52 indicates a fly-wheel diode. The generation-control circuit 5 has the same structure as a conventional voltage regulator which controls switching of the transistor 51, thereby, to control the field current so that the output voltage of the armature coils 11–13 is regulated to keep the B voltage (first voltage level) at a prescribed level. The above operation is common and, therefore, further description is omitted.

The three-phase full-wave rectifier 3 is composed of junction diodes as the high-side elements 31–33 and N-channel MOS transistors as the low-side elements 34–36. Each of the high-side elements 31–33 is connected in series to corresponding one of the low-side elements 34–36 to form three phase-circuits 37–39, which are connected in parallel with each other so that one end thereof is connected to the plus terminal of the battery 7 and the other end is connected to the minus terminal of the battery 7. Each of junctions or AC terminals 41–43 of the elements 31–36 of the phase circuits 37–39 is connected to a corresponding terminal of the armature coils 11–13.

The main electrode of the battery-minus-terminal-side of each of the low-side elements 34–36, which are composed of the N-channel MOS transistors, is connected to the P-type-plate-region (P-type plate or P-type well-region) right under the gate to provide the region with an electrical potential. Therefore, in this embodiment, a parasitic diode D is formed at the junction between the armature-coil-side-main-electrode of the each of the low-side elements 34–36 and the P-type-plate-region. The parasitic diodes D function as the low-side elements of the three-phase full-wave rectifier. It is possible to connect rectifying junction diodes to the low-side elements 34–36 in parallel therewith.

The transistors 34–36 are D-MOS-type or vertical-type power MOS transistors.

Thus, the three-phase full-wave rectifier, which is composed of the junction diodes for the high-side elements 31–33 and the parasitic diodes D, rectifies the output voltage of the three-phase AC generator 1 and charge the battery 7.

An excessive-voltage control circuit (which is composed of an excessive-voltage-detecting circuit and a short-circuiting means or control means) 6 is described hereafter.

The excessive-voltage control circuit 6 is composed of three voltage-dividing-circuits 6a which are three series circuits of resistors R1 and R2, resistors R3 and R4 and resistors R5 and R6, and also three comparators 61–63, which detect whether the output voltage of any of the armature coils 11–13 exceeds a prescribed voltage level (second voltage level) and turn on one of the MOS transistors 34–36 of a phase if the output voltage of this phase is detected to be higher than the prescribed voltage level.

The voltage-dividing-circuit 6a divides the phase voltage V1 of the armature coil 11, the voltage-dividing-circuit 6a divides the phase voltage V2 of the armature coil 12 and the voltage-dividing-circuit 6a divides the phase voltage of the armature coil V3. A reference numeral 60 is a constant voltage circuit for providing a reference voltage Vref which corresponds to the second voltage level by a voltage supplied from the battery 7 through a resistor r5 from an ignition switch IGSW.

The comparators 61–63 compare divided voltages of the phase voltages V1–V3 with the reference voltage respectively and supply a high level signal to the gates of the MOS transistors 34–36, which are the low-side elements of the three-phase full-wave rectifier 3, through gate resistors rg for cutting high-frequency waves, thereby turning the transistors on.

The operation of excessive-voltage-control circuit 6 is described next.

When no giant-pulse-voltage is generated, the output voltage of the voltage-dividing-circuit 6a is lower than the reference voltage Vref so that the output voltage of the comparator 61–63 becomes low, thereby causing the transistor 34–36 to be non-conductive.

If one of the terminals of the battery 7 in the charging operation is disconnected or if the output current of the three-phase full-wave rectifier 3 suddenly decreases, a giant-pulse-voltage is generated in one of the armature coils in generation and is sent to the B terminal through the rectifier 3.

If the giant-pulse-voltage becomes high enough to make one of the comparators 61–63, which corresponds to the one generating the giant-pulse-voltage, generate the high level signal, the corresponding one of the MOS transistor 34–36 is turned on. Consequently, a current flows from the coil generating the giant-pulse-voltage to a ground line so that the corresponding MOS transistor clamps the coil generating the giant-pulse-voltage. As a result; the excessive giant pulse sent from the high-side element for the phase coil generating the giant pulse to the electric load 9 is suppressed so that bad influence on the electric load 9 and the battery 7 can be suppressed. Because the voltage of the armature coil generating the giant-pulse-voltage is suppressed, the withstand voltage of the MOS transistor, which is one of the low-side elements connected to the armature coil generating the giant-pulse-voltage, can be lowered.

When a divided voltage of the giant-pulse-voltage becomes lower than the reference voltage Vref, the comparator corresponding to the armature coil generating the giant-pulse-voltage produces the low level signal so that the MOS transistor corresponding to the armature coil generating the giant-pulse-voltage is turned off. As a result, the full-wave rectifier 3 returns to the normal rectifying operation.

If the comparator 61 detects the giant pulse and produces the high level signal to turn on the MOS transistor 34, the output voltage of the armature coil 11 generating the giant pulse suddenly lowers and, subsequently, the comparator 61 produces the low level signal to turn off the transistor 34. Then, the output voltage of the armature coil 11 increases again, thereby causing the comparator 61 to produce the high level signal, which turns on the transistor 34. Thus, on-off operation of the comparator 61 and the MOS transistor 34 and resultant intermittent current of the diode 31 of the high-side element follows. The MOS transistor 34 is switched on and off at a high frequency, and the giant-pulse-voltage is controlled so that the output voltage VB becomes a second voltage (two or three times as high as the battery voltage). As a result, all the semiconductor elements are prevented from the breakdown and excessive voltage to be applied to electric loads is prevented.

When one of the MOS transistors of the armature coil generating the giant-pulse-voltage (e.g. MOS transistor 34) is turned on, at least one negative phase voltage V2 or V3 is generated by the remaining armature coils 12 or 13, so that the parasitic diode D of at least one of the MOS transistors 35 and 36 connected to the remaining armature coils 12 and 13 is turned on to allow a circulating current, thereby dissipating the magnetic energy accumulated by the magnetic circuit including the armature coils 11–13 of the generator 1 and reducing the giant-pulse-voltage.

Figure 2:
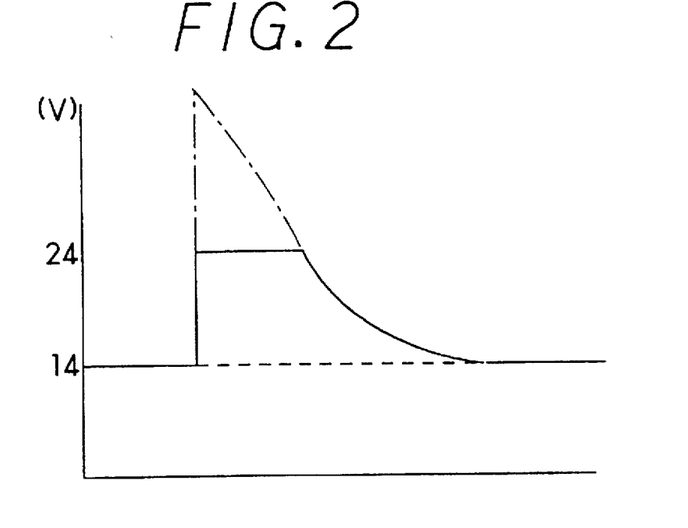
FIG. 2 is a graph showing a giant pulse.

FIG. 2 shows the giant pulse in the output voltage of the rectifier 3. In FIG. 2, a one-dot-chain line indicates a giant-pulse-voltage when no control is provided; a solid line indicates a generated voltage when the giant pulse voltage is suppressed to two times as high as the battery voltage; and a broken line indicates a generated voltage when the giant-pulse-voltage is suppressed slightly higher (about 14 V) than the forward voltage drop of the diodes for the high-side elements (or about 0.7 V) plus the battery voltage.

(Second Embodiment)

A second embodiment of the present invention is described with reference to FIG. 3.

This embodiment is the same as the first embodiment except that the excessive-voltage-control circuit 6 of the first embodiment is replaced with an excessive-voltage-control circuit 600, which has three series circuits of constant-voltage-diode 311 and a resistor rg. Each of the series circuits is connected between the main electrode (or drain) and the gate of the MOS transistors 34–36 (low-side elements).

When the giant-pulse-voltage is generated, the constant-voltage-diode 311 of the armature coil generating the giant-pulse-voltage breaks down and the gate of the MOS transistor generating the giant-pulse-voltage is charged to a level higher than the threshold level after a while decided by the time constant of an integrating circuit composed of the resistor rg and the gate capacity. Consequently, the MOS transistor is turned on and suppresses the giant pulse voltage in the same manner as the first embodiment. Because only a small amount of current flows through the constant-voltage-diodes 311, they can be made compact. When no giant-pulse-voltage is generated, the constant-voltage-diodes 311 do not break down, so that the transistors 34–36 remain off and the parasitic diodes D rectify the output voltage.

The electric charge on the gate is discharged when the output voltage of the armature coil generating the giant-pulse-voltage is lower than the gate potential by at least the forward-voltage-drop of the constant-voltage-diodes. When the gate potential becomes lower than the threshold level, the MOS transistor is turned off.

The operation of the MOS transistors 34–36 and controlling of the giant-pulse-voltage are the same as the first embodiment and, therefore, description thereof is omitted. The break-down voltage of the constant-voltage-diodes 311 can be changed properly. Therefore, the circuit structure becomes simple.

(Third Embodiment)

A third embodiment of the present invention is described with reference to FIG. 4.

This embodiment is different from the first embodiment in that the excessive-voltage-control circuit 6 is replaced with an excessive-voltage-control circuit 601, diodes are used for the low-side elements 34–35, and N-channel MOS transistors are used for the high-side elements 31–33.

The excessive-voltage-control circuit 601 is composed of comparators 612–614 for comparing three output voltages of the voltage-dividing-circuit 6a (same as that of the first embodiment) with the ground potential, a voltage-dividing-circuit having resistors R7 and R8 for dividing the output voltage VO of the three-phase full-wave rectifier 3, a comparator 611 for comparing the divided voltage of the output voltage VO with the reference voltage Vref and AND gates 621–623. The output voltages of the AND gates 621–623 are applied to the gates of the MOS transistors for the high-side elements respectively through the resistors rg. The parasitic diodes D of the MOS transistors for the high-side elements are connected so that the anodes come to the sides of the armature coils 11–13.

The operation of the above circuit is described next.

The comparator 611 compares the divided voltage of the output voltage VO divided by the voltage-dividing-circuit composed of the resistors R7 and R8 with the reference voltage. It sends the high level signal to the AND gates 621–623 when the output voltage VO is higher than the reference voltage.

The comparators 612–614 determine whether each terminal voltage of the armature coils 11–13 is lower than the ground voltage and send the high level signal to the AND gates 621–623 if the terminal voltage is lower than the ground voltage.

Consequently, the AND gates 621–623 send the AND signal of the logical output of the comparator 611 and each logical output of the comparators 621–623 to the gates of the MOS transistors for the high-side elements through the resistors rg. In other words, when the giant-pulse-voltage is generated (when the comparator 611 produces the high level signal), the MOS transistor (e.g. 31) connected to one (e.g. 11) of the armature coils generating a negative output voltage is turned on. Thus, an electric current flows from the one (e.g. B) of output terminals of the rectifier 3 including the giant-pulse-voltage through the corresponding MOS transistor (e.g. 11) to the armature coil (e.g. 12) generating the negative voltage, thereby suppressing the giant-pulse-voltage included in the output voltage V0.

Therefore, the giant-pulse-voltage is attenuated by the rectifier 3 and the armature coils 11–13 in the same manner as the first and second embodiments.

The intermittent operation of the MOS transistors for the high-side elements and suppression of the giant-pulse-voltage are the same as the first and second embodiments, and the voltage suppressing operation of the low-side elements 34–36 and the MOS transistors for the high-side elements by the giant-pulse-voltage is the same as the first and second embodiments.

(Fourth Embodiment)

A fourth embodiment is described with reference to FIG. 5.

This embodiment has additional transistor-control-circuits 8 for the respective MOS transistors 34–36 of the first embodiment.

Each of the transistor-control-circuit 8 is composed of a comparator 85, diodes 86 and 87 and a resistor r8 and is connected to one of the MOS transistors 34–36.

Figure 1:
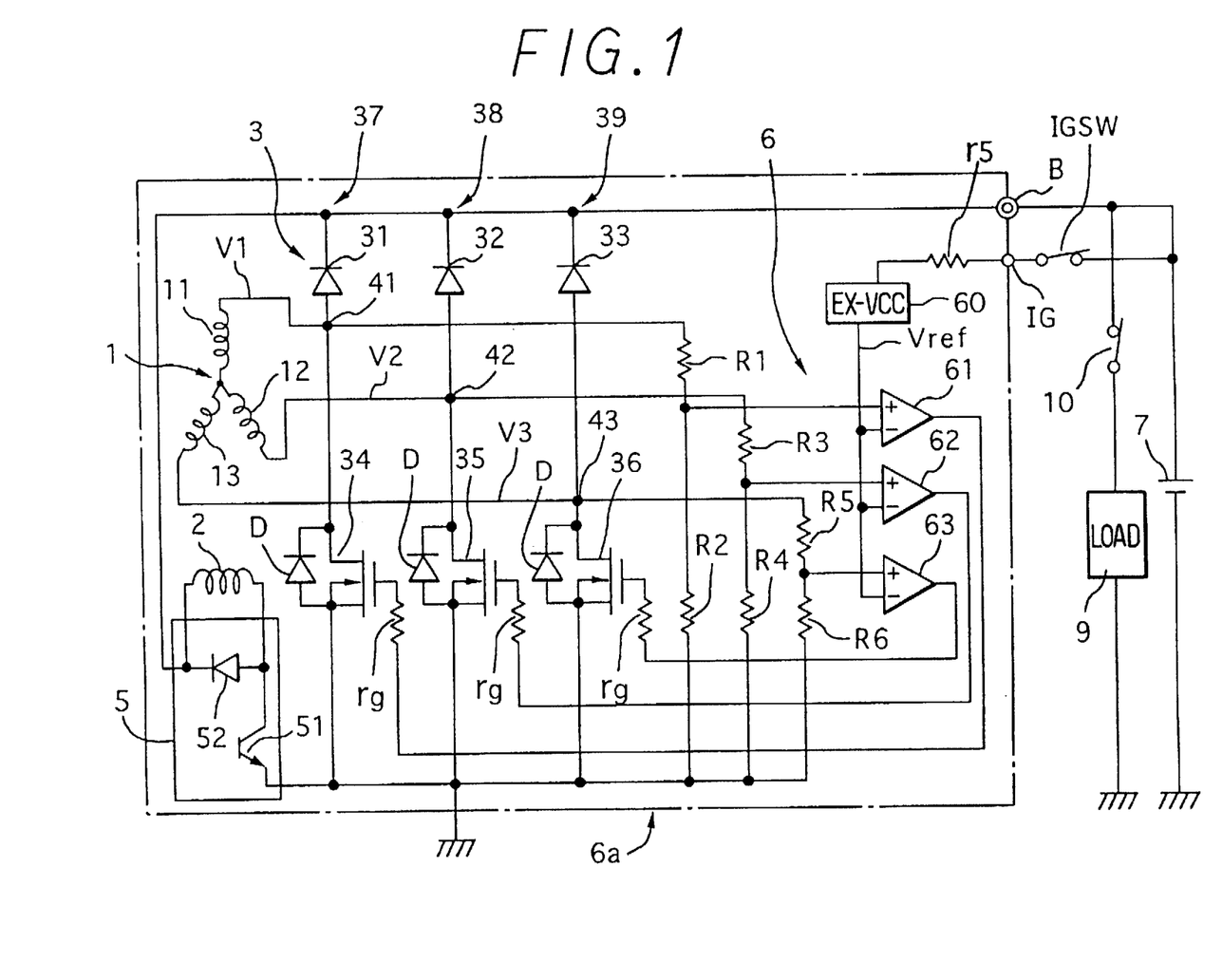
FIG. 1 is a circuit diagram of a generating apparatus according to a first embodiment of the present invention.

The output voltage of the comparator 61, which is shown in FIG. 1, is applied to the diode 87. The comparator 85 determines whether the terminal voltage of the armature coil 11 is lower than the ground voltage. If the terminal voltage is lower, the high level signal is applied to the gate of the transistor 34 to turn it on. On the other hand, if the terminal voltage is higher than the ground voltage, the low level signal is produced so that the MOS transistor 34 operates in the control mode of the second embodiment.

Thus, the MOS transistor 34 rectifies the current through the channel thereof in addition to the current flowing through the parasitic diode D so that power loss due to the rectifying of the current can be reduced.

Instead of applying the generated voltage of the armature coil 11 to the comparator 85, a divided voltage thereof can be applied thereto.

(Variation)

Figure 3:
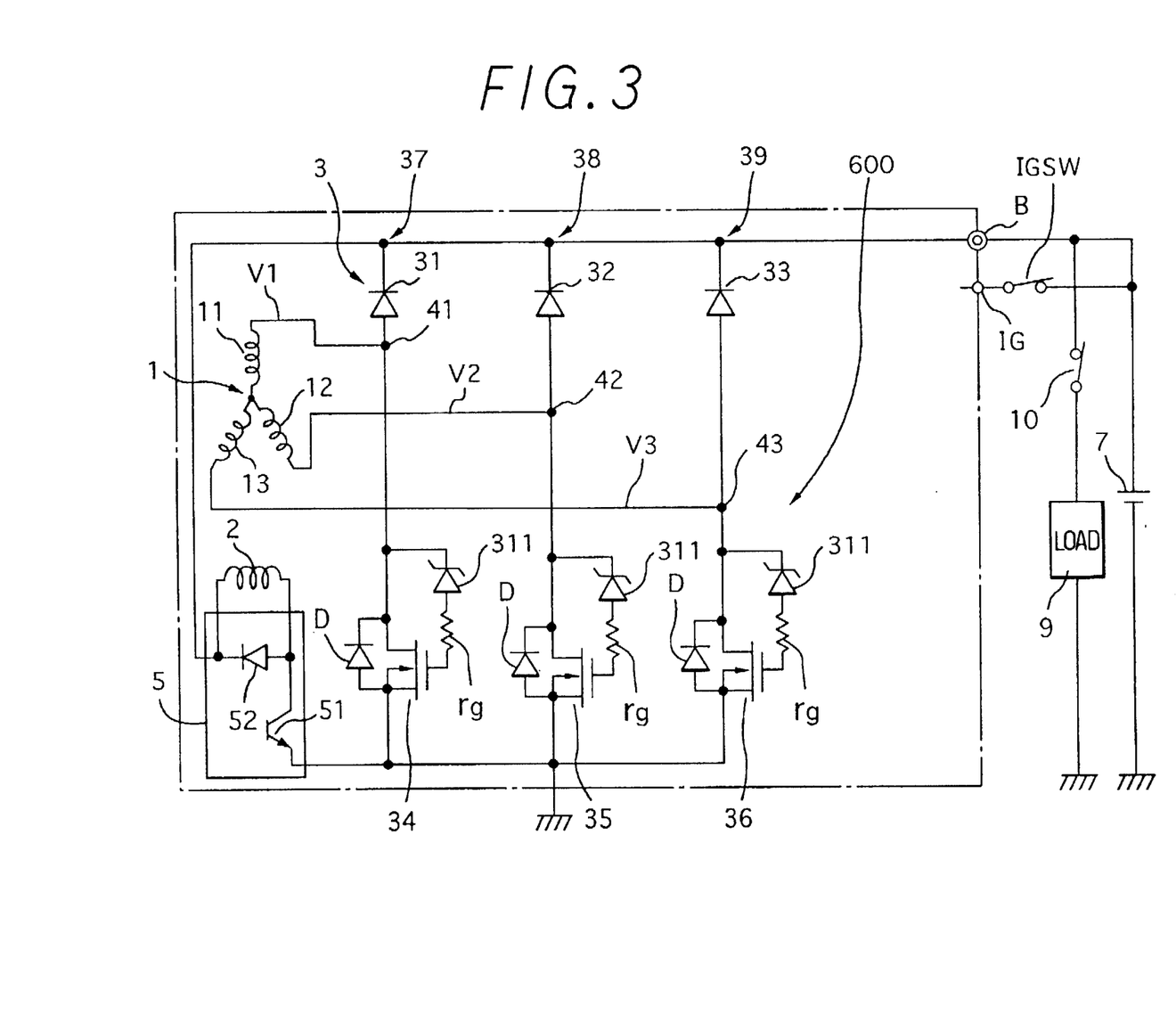
FIG. 3 is a circuit diagram of a generating apparatus according to a second embodiment of the present invention.
Figure 5:
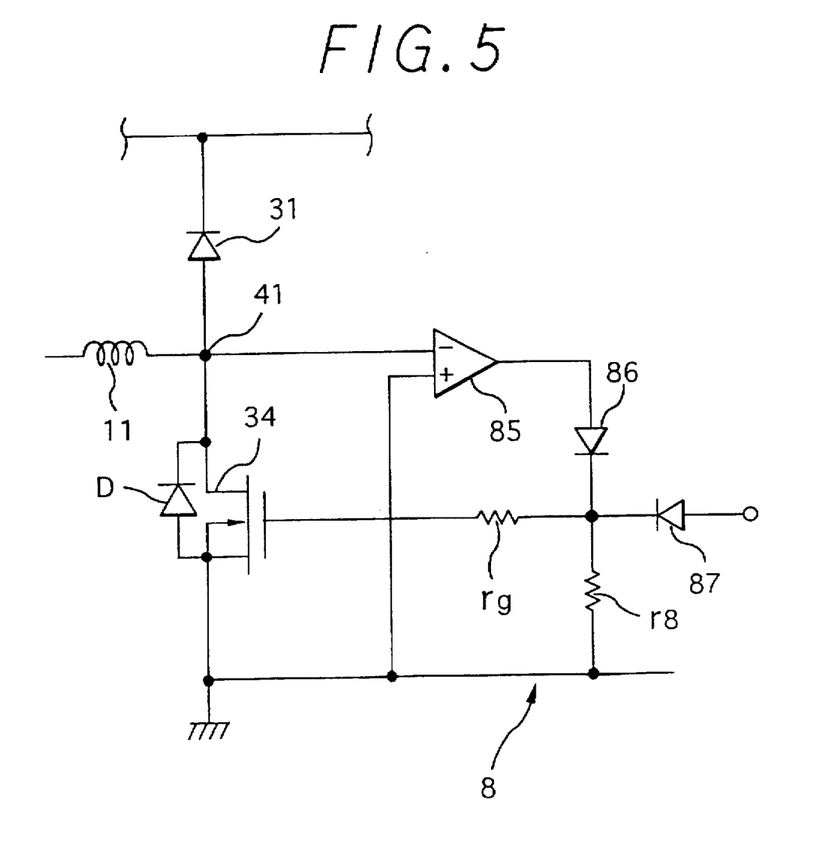
FIG. 5 is a circuit diagram of a main portion of a generating apparatus according to a fourth embodiment of the present invention.

In the second embodiment as shown in FIG. 3, the MOS transistor 34–36 function as the rectifying elements if the circuit shown in FIG. 5 is added to each of the MOS transistors 34–36. In this case the diode 87 can be omitted.

Figure 4:
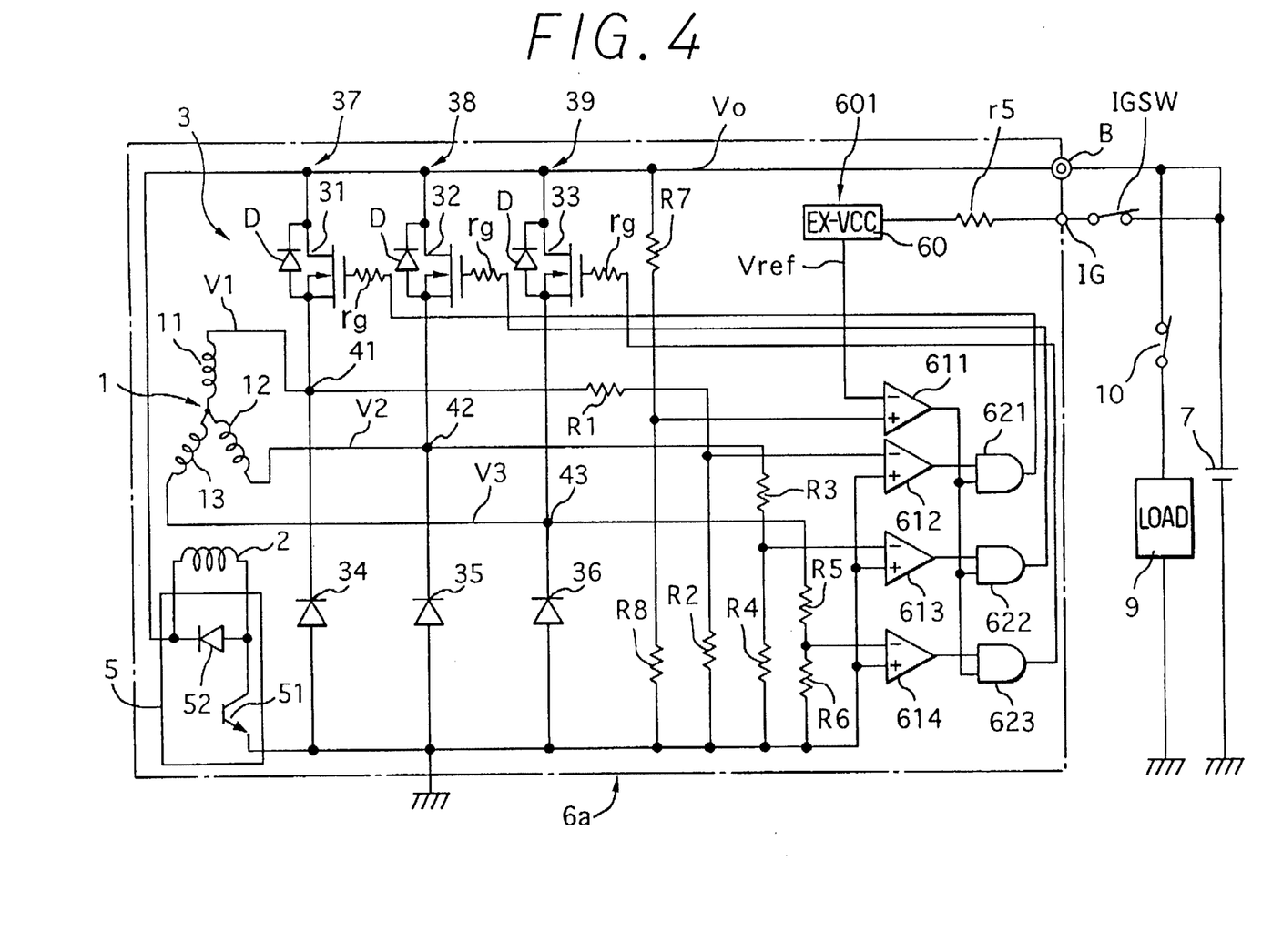
FIG. 4 is a circuit diagram of a generating apparatus according to a third embodiment of the present invention.
Figure 6:
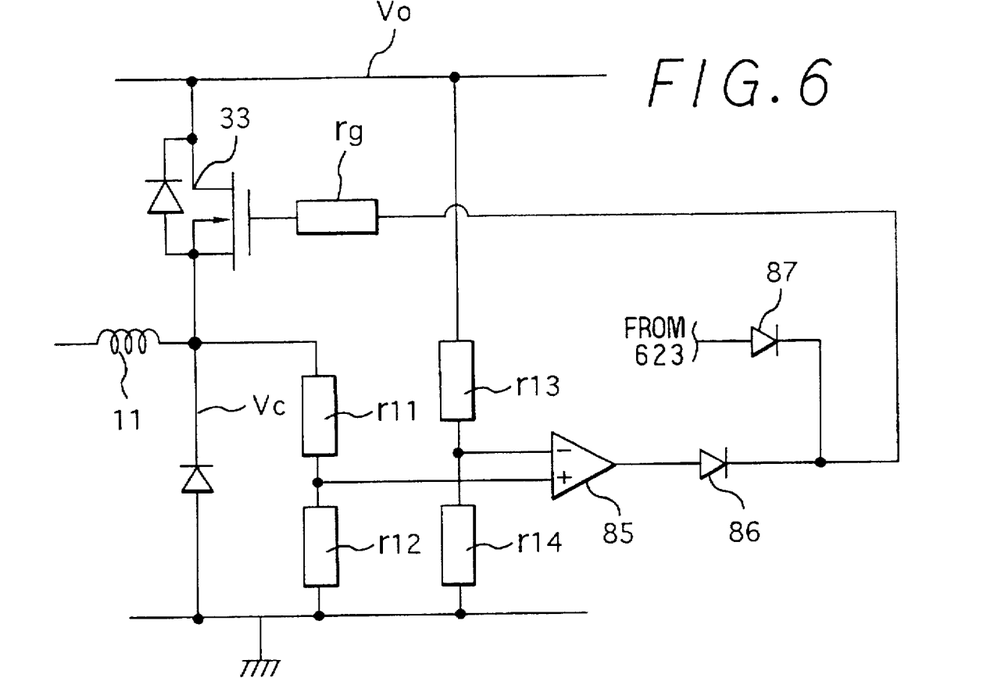
FIG. 6 is a circuit diagram which is modified from the circuit according to the fourth embodiment to correspond to the generating apparatus according to the second embodiment.
Figure 7A:
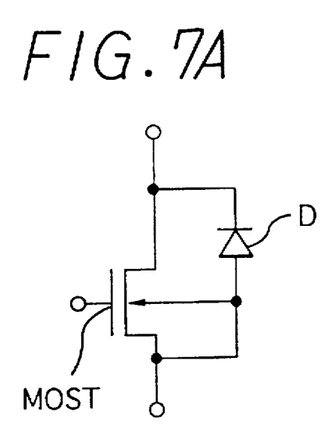
FIGS. 7A, 7B, 7C, 7D and 7E are circuit diagrams composed of various elements forming a high-side element or a low-side element of the generating apparatus according to the first embodiment, wherein 7A illustrates a Si-MOS transistor, 7B illustrates a junction diode, 7C illustrates IGBT, 7D illustrates BFT and 7E illustrates SiC-MOS transistor.
Figures 7B, 7C:
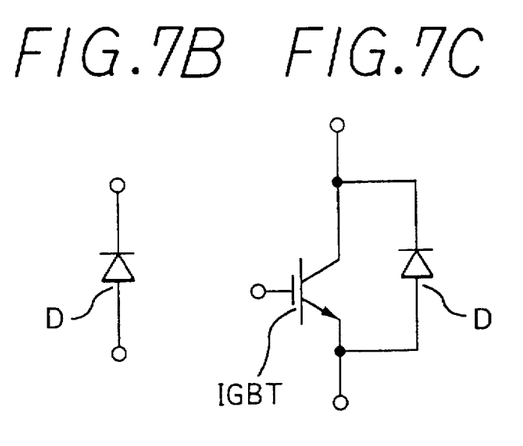
Figure 7D:
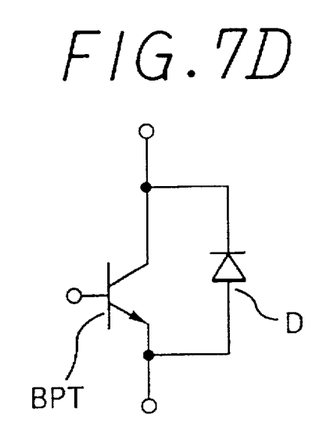
Figure 7E:
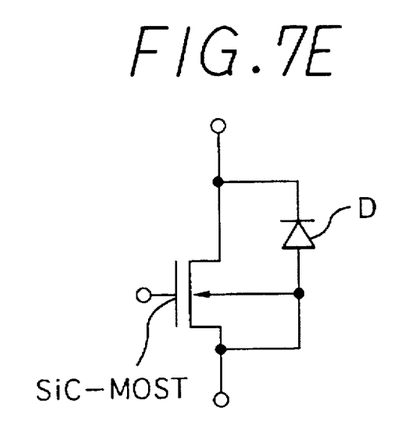

In the third embodiment as shown in FIG. 4, the MOS transistor for the high-side elements function as the rectifying elements if a circuit shown in FIG. 6 which operates in the same manner as the circuit shown in FIG. 5 is added to each of the armature coils. In this case, the output voltages of the AND circuits 621–623 are applied respectively to the diode 87.

In this embodiment, the comparator 85 produces the high level signal to turn on the MOS transistor 33 in FIG. 4 when the generated voltage Vc becomes higher than the battery voltage or the output voltage VO of the three-phase full-wave rectifier 3.

In the first and second embodiments, each of the high-side elements 31–33 is composed of a junction diode, and each of the low-side elements is composed of a MOS transistor and the parasitic diode thereof. However, either one of the following elements can be used as the high-side or low-side element: (a) MOS transistor having the parasitic diode, (b) junction diode, (c) IGBT with a parallel junction diode, (d) bipolar transistor having a parallel junction diode and (e) SiC-MOS transistor having the parasitic diode.

It is noted that either the high-side elements 31–33 or the low-side elements must use the transistors. The high-level signals of the comparator 85 and the AND gates 621–623 are set to be high enough to turn on the MOS transistors for the high-side elements.

The PWM (pulse width modulation)-control system can be introduced to suppress heating of the transistors which are used for the high-side elements 31–33 or the low-side elements. The PWM-control system can be composed of an oscillator for generating a constant-frequency-signal-voltage of a suitable duty ratio, an AND circuit taking in the constant-frequency-signal-voltage and the collector voltage of the transistor shown in FIG. 1 or the voltage to turn on all the MOS transistors 34–36. The PWM-control system is added to the circuit 5 to control the MOS transistors 34–36 according to the AND signal of the AND circuit. The circuit structure is simple and obvious, and further description thereof is omitted.

The heat-resistant SiC-MOS transistors are preferably used to cope with the temperature rise while the giant-pulse-voltage is controlled.

(Fifth Embodiment)

A fifth embodiment of the present invention is described with reference to FIG. 8.

The difference in this embodiment from the second embodiment (shown in FIG. 3) is resistors r21 connected between each gate of the MOS transistors 34–36 and a ground.

The features of this embodiment is described below.

In the second embodiment, if the constant diode 311 corresponding to the armature coil 13 generating the giant-pulse-voltage breaks down and the gate of the MOS transistor 36 for the armature coil 11 generating the giant-pulse-voltage is charged, the MOS transistor 36 is not turned off as long as the giant-pulse-voltage is not lower than the threshold level which is lower than the battery voltage. Therefore, the normal output voltage is not generated immediately. In this embodiment, the resistors 21 for gate-discharging-path can prevent the above problem. The gate voltage applied to the gate of the MOS transistor 36 is (V3–Vz)×r21/(rg+r21), if the generated voltage is V3. If the gate voltage is higher than the threshold level, the MOS transistor 36 is turned on. Vz is a breakdown voltage of the constant diode 311.

(variation)

A variation of the fifth embodiment is described with reference to FIGS. 9A and 9B.

Figure 8:
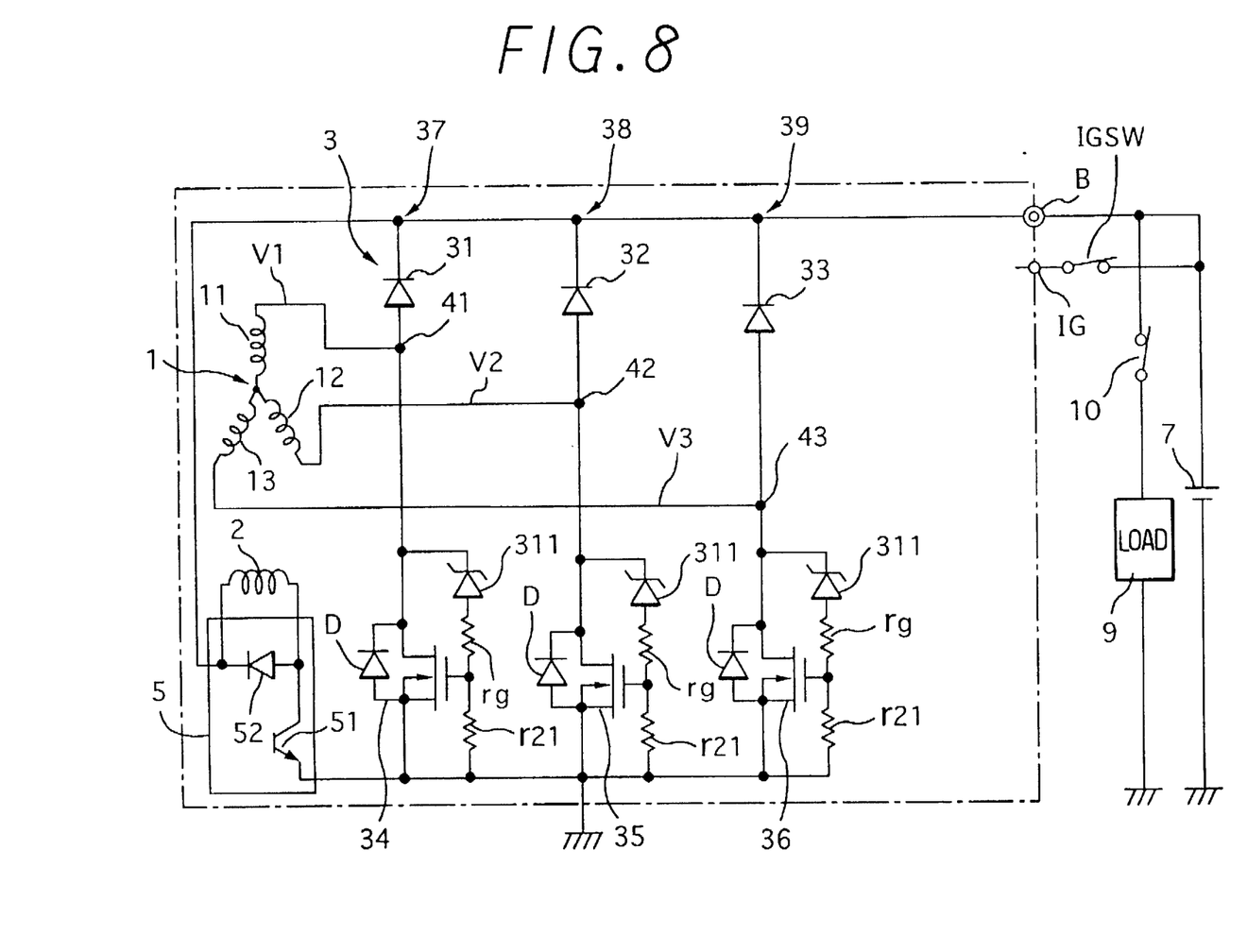
FIG. 8 is a circuit diagram of a generating apparatus according to a fifth embodiment of the present invention.
Figure 9A:
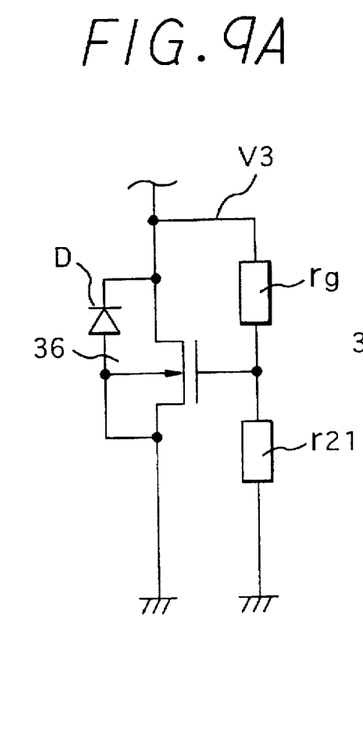
FIGS. 9A and 9B are circuit diagrams of portions modified from the corresponding portion of the circuit according to the fifth embodiment.

FIG. 9A shows the same portion as shown in FIG. 8 except for the constant voltage diode 311. In this case, the voltage dividing circuit is composed of the resistors rg and r21. When the voltage divided by both resistors rg and r21 becomes the threshold level of the MOS transistor 36, the transistor 36 is turned on. For example, if the output voltage V3 is turned on at 18 volt with the threshold level of the MOS transistor being 3 volt, the dividing ratio of the resistors rg and r21 is 6:1.

Figure 9B:
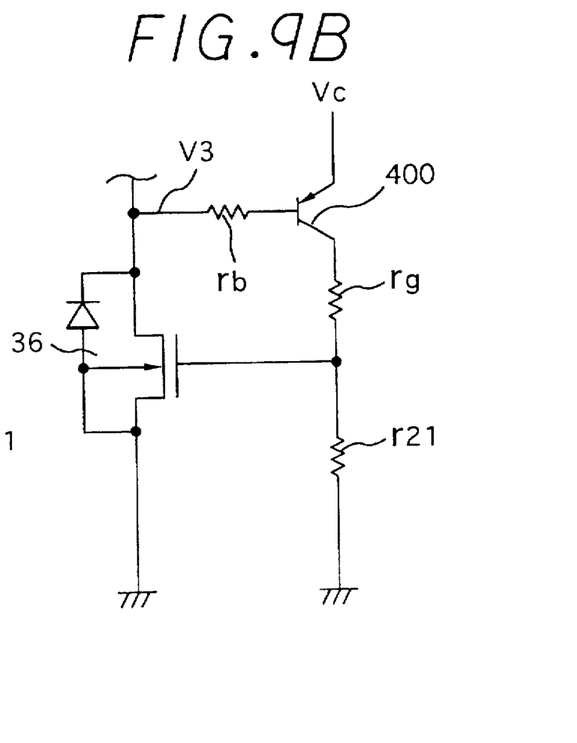

FIG. 9B shows the same portion as shown in FIG. 8 except that the constant voltage diode 311 is replaced with a pnp transistor 400. A reference character rb is a resistor. If the giant pulse is generated, the transistor 400 is turned on to turn on the MOS transistor 36. The emitter voltage of the transistor 400 is set twice as high as the battery voltage. An inverting-amplifying-circuit can be replaced with the pnp transistor 400.

(Sixth Embodiment)

A sixth embodiment of the present invention is described with reference to FIG. 10.

The circuit according to this embodiment has a bridge circuit composed of N-channel MOS transistors instead of the high-side element 31–33 of the rectifier 3 of the first embodiment (shown in FIG. 1) and a controller 53 included in the generation-control-circuit 5 for controlling the MOS transistors 31–36. The controller 53 is supplied with the B voltage, and is driven to operate when the IG voltage becomes high. The controller 53 controls the transistor 51 so that the B voltage becomes a certain voltage (first voltage level) and controls the MOS transistors 31–36 successively according to the output signals of the comparators 61–63 to rectify the generated phase-voltages V1, V2 and V3. A parasitic diode (not shown) is connected between the source and drain of each one of the MOS transistors 31–36 with the cathode thereof connected to the drain and the anode thereof connected to the source (P-well). A circuit for controlling a pair of transistors for one phase (e. g. MOS transistor 31 and 34) of the MOS transistors 31–36 is shown in FIG. 11. The operation of the circuit for the phase voltage V1 is described next.

When the giant pulse is not generated in the normal rectifying operation, the comparator 61 produces the low level signal. Therefore, the high level signal (which is the excessive-voltage-detecting-signal) is not applied to a NOR gate 500 or an OR gate 501. On the other hand, a low-side-element control-signal (which is the high level signal produced by the comparator 85 shown in FIG. 5) is applied through the OR gate 501 to the gate of the MOS transistor 34, thereby turning on the same. The high-side-element control-signal in the high voltage level, which is given by the comparator 85 shown in FIG. 6, is inverted by an inverter 502 and applied to the NOR gate 500, which sends the high level signal to the gate of the MOS transistor 31 (high-side element) to turn on the same.

When the giant-pulse-voltage is generated in the armature coil 11, the comparator 61 produces the high level signal as the excessive-voltage-detecting-signal. When the high voltage signal is sent to the NOR gate 500 and the OR gate 501, the NOR gate 500 produces the low level signal and the OR gate 501 produces the high level signal to turn off the MOS transistors 31 and turn on the MOS transistor 34 respectively, thereby attenuating the giant-pulse-voltage.

In other words, when the giant-pulse-voltage is generated, the low-side MOS transistor of the bridge circuit (full-MOStransistor-type-bridge-circuit) is turned on to suppress the giant-pulse-voltage and turn off the high-side MOS transistor 31 so that the giant-pulse-voltage is prevented from reaching the battery 7 and the load 9 through the channel of the MOS transistor 31.

Since a pair of the MOS transistors 32 and 35 and a pair of the MOS transistors 33 and 36 operate in the same manner as the MOS transistors 31 and 34, the description of their operation is omitted. Circuits which drive the MOS transistors for the high-side elements 31–33 such as AND gates 621–623 shown in FIG. 4, the comparator 85 shown in FIG. 6, the NOR gate 500 or the OR gate 501 are arranged to produce a voltage higher than the battery voltage in order to operate the MOS transistors for the high-side elements 31–33 in the unsaturated state. If PMOS transistors are used for the high-side elements 31–33, the above condition is not necessary. In the three-phase-rectifying circuit of the full-MOS-transistor-type-bridge-circuit according to this embodiment, the giant-pulse-voltage is suppressed by turning on the MOS transistors for the high-side elements 31–33 as described in regard to the third embodiment. In this case, the MOS transistor for one of the low-side elements 34–36 corresponding to the high-side element of the same phase which is turned on to absorb the giant-pulse-voltage is turned off.

According to this embodiment, the three-phase full-wave rectifier 3 of the full-MOS-transistor-type has a structure for suppressing the giant-pulse-voltage generated in the armature coils 11–13. Therefore, no specific circuit to prevent the giant-pulse-voltage is necessary, resulting in a simple and compact circuit.

(Seventh Embodiment)

Figure 12:
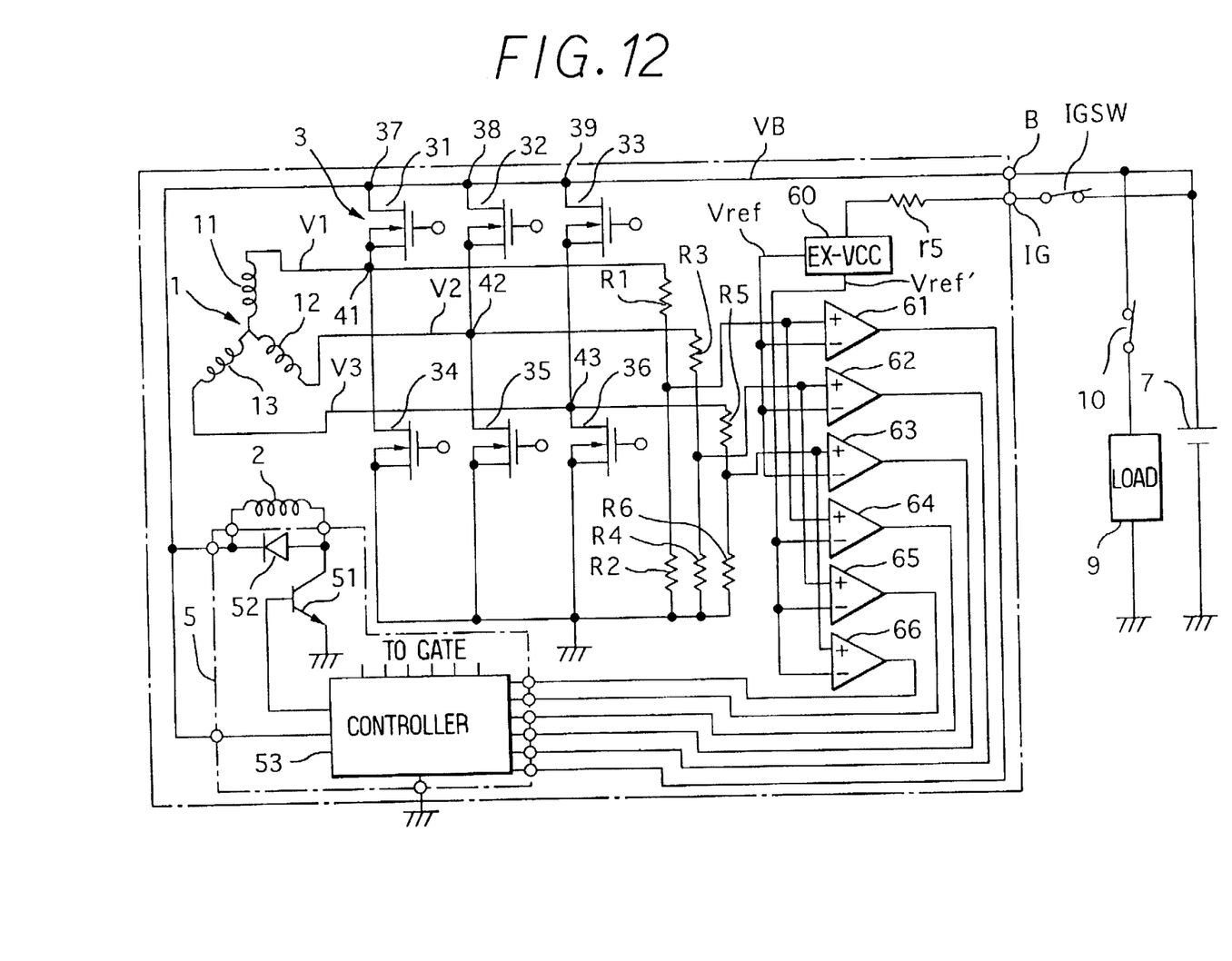
FIG. 12 is a circuit diagram of a generating apparatus according to a seventh embodiment of the present invention.
Figure 13:
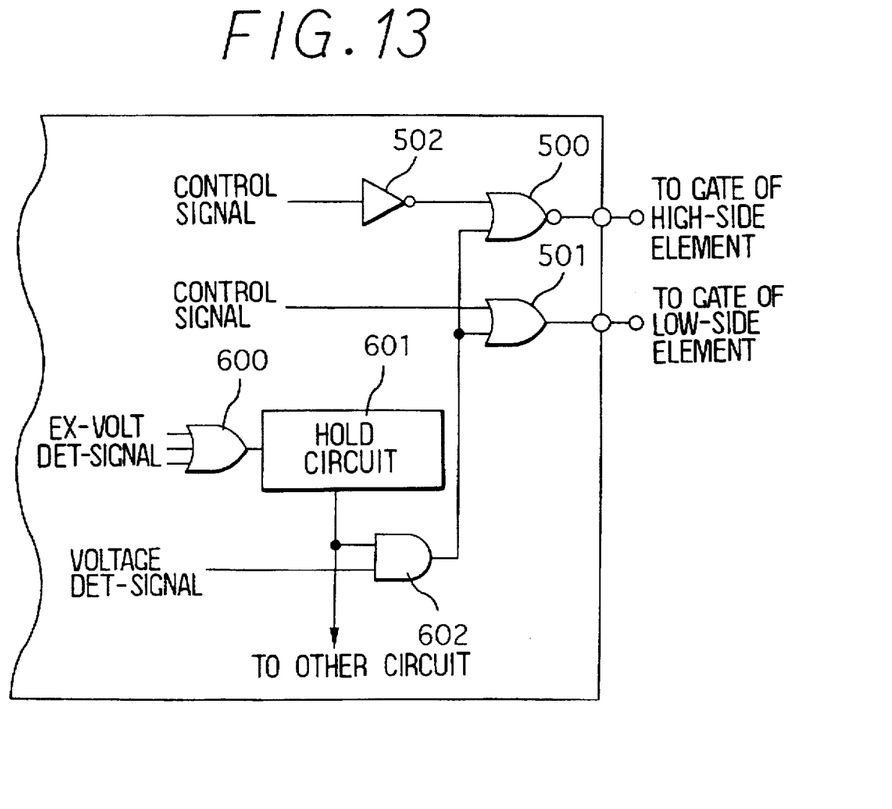
FIG. 13 is a circuit diagram of a main portion of the controller shown in FIG. 11.

A seventh embodiment according to the present invention is described with reference to FIG. 12 and FIG. 13.

Figure 10:
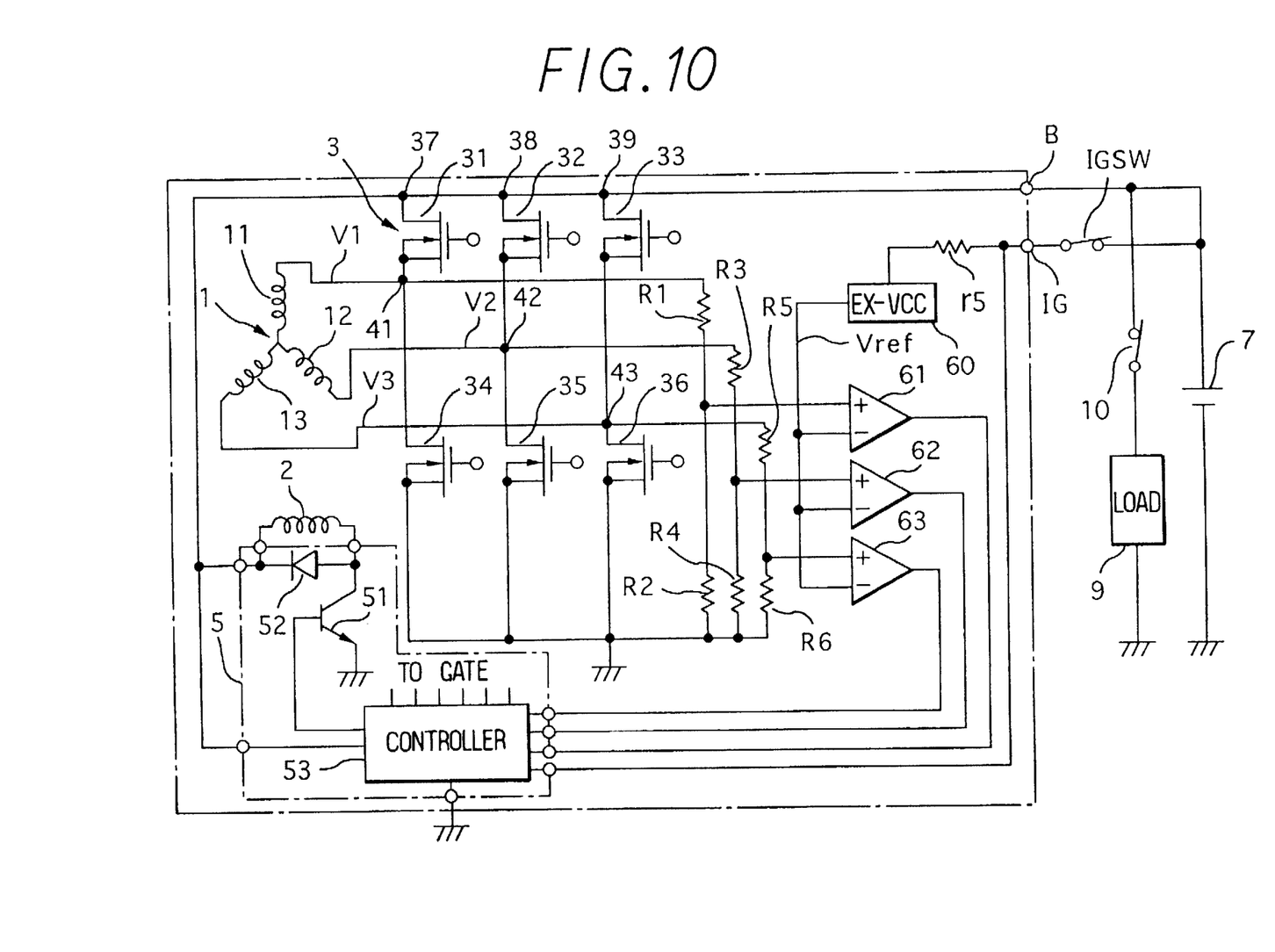
FIG. 10 is circuit diagram of a generating apparatus according to a sixth embodiment of the present invention.
Figure 11:
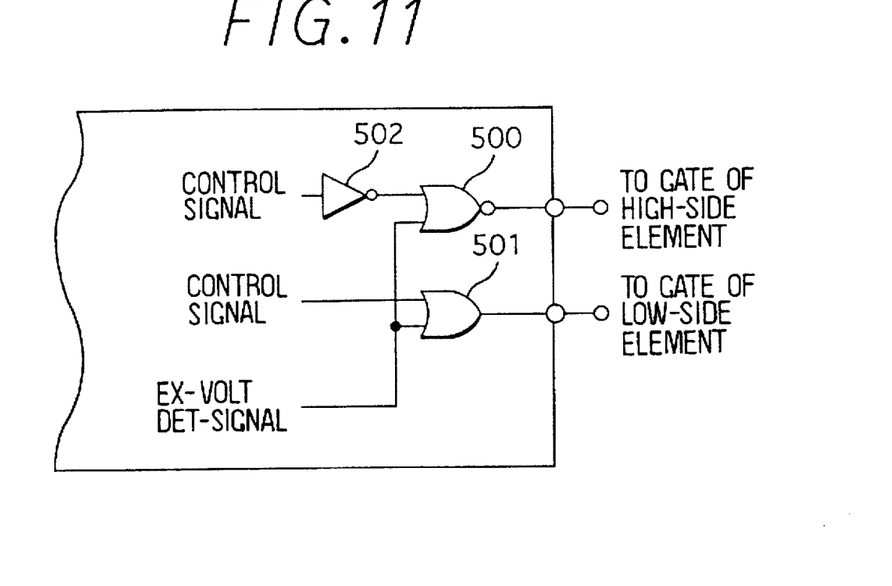
FIG. 11 is a circuit diagram of a main portion of a controller shown in FIG. 10.

The circuit according to this embodiment is the same as the circuit according to the sixth embodiment shown in FIG. 10 except that comparators 64–66 are added, the constant voltage source 60 generates a reference voltage Vref' (a divided voltage of a third voltage level) which is lower than the reference voltage Vref (a divided voltage of the second voltage level) and an OR gate 600, a hold circuit 601 and an AND gate 602 are added. Only one pair of the OR gate 600 and the hold circuit 601 is provided for the entire phases. However, the AND gate 602 is provided for each phase.

The comparator 64 compares a divided voltage of the generated voltage (phase voltage) V1 of the armature coil 11 with the reference voltage Vref', the comparator 65 compares a divided voltage of the generated voltage (phase voltage) V2 and the comparator 66 compares a divided voltage of the generated voltage (phase voltage) V3 with the reference voltage 13. Each output voltage of the comparators 61–66 is sent to the controller 53. The controller 53 for one phase is shown in FIG. 13. The OR gate 600 and the hold circuit 601 are common to all the phases as stated above.

The operation of the circuit for the phase corresponding to the generated voltage V1 according to this embodiment is described next.

When the giant-pulse-voltage is generated any one of the stator coils 11–13, corresponding one of the comparators 61–63 produces the high level signal as the excessive-voltage-detecting-signal, and the OR gate 600 sends the high level signal (indicating generation of the giant-pulse-voltage-signal) to the hold circuit 601, which sends the high level signal as the excessive-voltage-detecting-signal continuously until the controller 53 is deenergized. The controller of this embodiment is supplied with the voltage VB of the battery as long as the IG voltage is in the high level.

Therefore, the holding operation of the holding circuit 601 continues until the ignition switch IGSW is turned off.

The output voltage of the comparator 64 is applied to the AND gate 602 as the voltage detecting signal. The comparator 64 produces the high level signal when the divided voltage of the giant-pulse-voltage included in the generated voltage V1 becomes higher than the reference voltage Vref'. The reference voltage Vref' is higher than a divided voltage of a lowest voltage to drive the electric load and lower than the reference voltage Vref.

Figure 14:
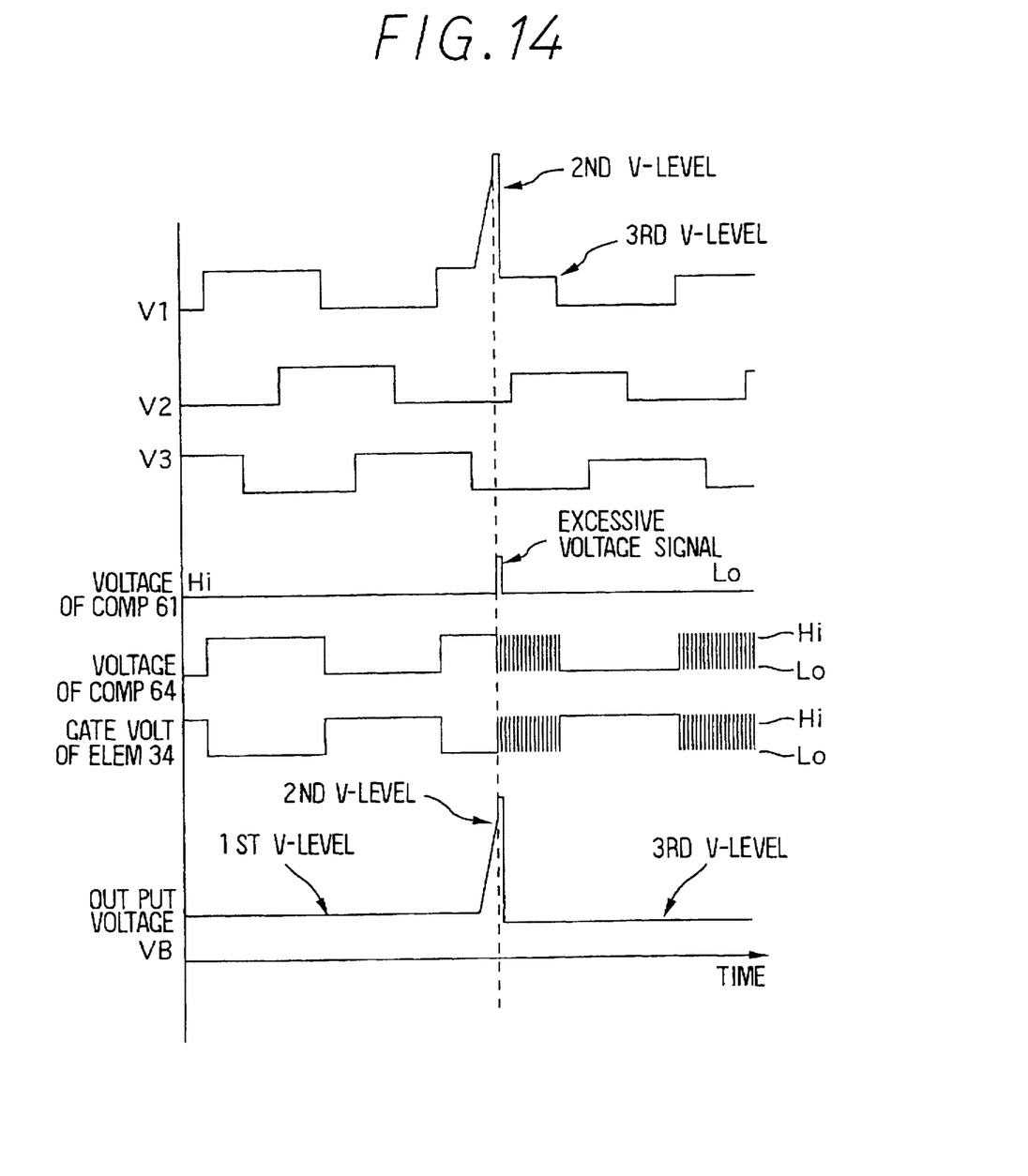
FIG. 14 is a timing chart showing voltage changes at main portions of the circuit shown in FIG. 12.

Therefore, if the divided voltage of the generated voltage V1 becomes higher than the reference voltage Vref after the giant-pulse-voltage is detected, the high level signal is produced so that the holding circuit holds the high level signal. Thus, if the divided voltage of the generated voltage V1 becomes no higher than the reference voltage Vref', the low level signal is produced to turn on the MOS transistor 31 and turn off the MOS transistor 34 to supply the electric load 9 with the generated voltage V1. When the MOS transistor 31 is turned on and the MOS transistor 34 is turned off, the giant-pulse-voltage is generated because the giant-pulse-power is not sufficiently dissipated. However, the high-speed-switching-operation makes the comparator 64 produce the high level signal to turn off the MOS transistor 31 and turn on the MOS transistor 34, thereby reducing the giant pulse voltage and preventing it from reaching the electric loads. FIG. 14 shows voltage waves applied to various parts shown in FIG. 12.

In conclusion, according to this embodiment, the electric load 9 is energized at a voltage controlled by the reference voltage Vref' even after the giant-pulse voltage is generated.

This embodiment can be applied to any circuit other than the full-MOS-transistor-type bridge circuit 3 shown in FIG. 10. The holding circuit 601 of this embodiment can be replaced with a temporary holding circuit such as a monostable-multi-vibrator. In this case, the high level signal is held for a period (hundreds milli sec.) long enough for the giant-pulse-voltage to be attenuated. Thus, it is possible to return to the normal control operation after the holding operation is cancelled. The comparator 61–63 can be replaced with an A–D converter combined with a software for the microcomputer which produces the excessive voltage signal if the reliability thereof is as sufficiently high as the comparators 61–63.

In the foregoing description of the present invention, the invention has been disclosed with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than restrictive, sense.

What is claimed is:

1. A generating apparatus for a vehicle including an AC generator having a field coil and armature coils driven by an engine, a bridge circuit having high-side and low-side rectifying elements connected between each terminal of said armature coils and a battery, a control unit for controlling a part of said high-side and low-side elements, a voltage regulator for regulating the output voltage of said bridge circuit to a first voltage level, wherein said control unit comprises:
an excessive-voltage-detecting-means, connected to said armature coils for producing an excessive-voltage signal when a giant-pulse-voltage generated in said armature coils exceeds a second voltage level which is a certain-level higher than said first voltage level; and a short-circuiting means, connected to said excessive voltage-detecting-means and said armature coils, for selectively short-circuiting a part of said armature coils, thereby suppressing said giant-pulse-voltage by turning on a portion of said rectifying elements according to said excessive-voltage signal.

2. A generating apparatus as claimed in claim 1, wherein said short-circuiting means turns on one of the low-side elements of said bridge circuit.

3. A generating apparatus as claimed in claim 1, wherein said low-side element of said bridge circuit comprises a MOS transistor;

said control unit comprises a constant-voltage-drop element connected between a main terminal of said MOS transistor connected to said generator and the gate thereof; and said excessive-voltage detecting circuit comprises said constant-voltage-drop element for supplying a gate current when said output voltage exceeds a second voltage level.

4. A generating apparatus as claimed in claim 1, wherein said short-circuiting means turns on one of said high-side elements connected to a terminal of said armature coils in the negative potential according to an output signal of said excessive-voltage-detecting-means.

5. A generating apparatus as claimed in claim 1, wherein said second voltage level is not lower than two times and not higher than three times as high as the normal voltage of said battery.

6. A generating apparatus as claimed in claim 1, wherein said second voltage level is higher than a voltage which is a forward-voltage drop of a junction diode plus said first voltage level.

7. A generating apparatus as claimed in claim 1, wherein at least one of said high-side rectifying elements and low-side rectifying elements comprises SiC-MOS transistors.

8. A generating apparatus as claimed in claim 7, wherein said control unit intermittently controls said high-side MOS transistor to carry out AC-DC conversion.

9. A generating apparatus as claimed in claim 1, wherein one of said high-side elements and low-side elements is a parallel circuit composed of a bipolar transistor and a junction diode connected in a direction to rectify voltages generated in said armature coils.

10. A generating apparatus as claimed in claim 1, wherein at least a portion of said high-side and low-side rectifying elements comprises N-channel MOS transistors each of which has a parasitic diode disposed between P-type-plate-region right under the gate and N+-type region in a direction to rectify the voltage generated in said armature coils.

11. A generating apparatus as claimed in claim 1, wherein said control unit turns on a portion of said high-side and low-side rectifying elements at a certain average-conducting-ratio.

12. A generating apparatus as claimed in claim 1, wherein said short-circuiting means controls a portion of said high-side and low-side rectifying elements according to said excessive-voltage signal to suppress said output voltage of said bridge circuit to a level minimum to energize said electric load.

13. A generating apparatus as claimed in claim 1, wherein said high-side rectifying elements and low-side rectifying elements are MOS transistors.

* * * * *